(12) United States Patent
Debraal

(10) Patent No.: US 6,779,246 B2
(45) Date of Patent: Aug. 24, 2004

(54) METHOD AND SYSTEM FOR FORMING RF REFLECTIVE PATHWAYS

(75) Inventor: John Charles Debraal, Appleton, WI (US)

(73) Assignee: Appleton Papers Inc., Appleton, WI (US)

( * ) Notice: Subject to any disclaimer, the term of this patent is extended or adjusted under 35 U.S.C. 154(b) by 195 days.

(21) Appl. No.: 09/880,001

(22) Filed: Jun. 14, 2001

(65) Prior Publication Data

US 2002/0152605 A1 Oct. 24, 2002

Related U.S. Application Data

(63) Continuation-in-part of application No. 09/839,126, filed on Apr. 23, 2001.
(60) Provisional application No. 60/295,580, filed on Jun. 5, 2001.

(51) Int. Cl.[7] .............................................. H01Q 13/00
(52) U.S. Cl. ............................ 29/600; 29/825; 29/846; 29/847
(58) Field of Search ......................... 29/600, 825, 846, 29/845, 852, 847, 848

(56) References Cited

U.S. PATENT DOCUMENTS

| | | | |
|---|---|---|---|
| 2,582,685 A | * | 1/1952 | Eisler |
| 3,864,179 A | | 2/1975 | Davidoff |
| 3,909,912 A | | 10/1975 | Kiesling |
| 3,950,204 A | | 4/1976 | Williams |
| 4,265,703 A | | 5/1981 | Terliska |
| 4,294,867 A | | 10/1981 | Boaz |
| 4,303,489 A | | 12/1981 | Morrison, Jr. |
| 4,403,410 A | * | 9/1983 | Robinson |
| 4,407,685 A | | 10/1983 | Hankland |
| 4,719,470 A | | 1/1988 | Munson |
| 4,800,397 A | * | 1/1989 | Afzali-Ardakani et al. |
| 4,894,184 A | | 1/1990 | Fukuoka et al. |
| 4,937,935 A | | 7/1990 | Clariou |
| 4,958,560 A | | 9/1990 | Collins |
| 4,991,287 A | * | 2/1991 | Piatt et al. |
| 5,061,093 A | | 10/1991 | Yamaguchi et al. |
| 5,086,171 A | * | 2/1992 | Mathiaparanam |
| 5,137,560 A | | 8/1992 | Ohmura et al. |
| 5,157,012 A | * | 10/1992 | Mathiaparanam et al. |
| 5,189,952 A | | 3/1993 | Ohmura et al. |
| 5,204,681 A | | 4/1993 | Greene |
| 5,291,205 A | | 3/1994 | Greene |
| 5,332,412 A | | 7/1994 | Manabe et al. |
| 5,388,509 A | | 2/1995 | Cutcher |
| 5,390,595 A | | 2/1995 | Cutcher |
| 5,426,850 A | * | 6/1995 | Fukutomi et al. |
| 5,492,750 A | | 2/1996 | Shumaker, Jr. et al. |
| 5,581,257 A | | 12/1996 | Greene et al. |
| 5,604,972 A | | 2/1997 | McCarrick |
| 5,792,298 A | | 8/1998 | Sauer et al. |
| 5,792,520 A | | 8/1998 | Yamashita et al. |
| 5,826,329 A | * | 10/1998 | Roth |
| 5,831,531 A | | 11/1998 | Tuttle |
| 5,836,187 A | | 11/1998 | Janssen et al. |

(List continued on next page.)

Primary Examiner—Carl J. Arbes
(74) Attorney, Agent, or Firm—Birch, Stewart, Kolasch & Birch, LLP

(57) ABSTRACT

The present invention provides for a system and two methods for forming RF reflective pathways. These pathways can form a radio frequency identification tag. A first method uses a thermal transfer ribbon, coated with a conductive material that is engaged with a receiver substrate. A thermal print head will heat a composition on the thermal transfer ribbon in order to transfer it to the receiver substrate. This transfer composition forms the RF reflective pathway. In an alternative method, a receiver substrate is heated in order to react conductive material thereon. This receiver substrate is also heated by a thermal print head to form a RF reflective pathway.

17 Claims, 1 Drawing Sheet

U.S. PATENT DOCUMENTS

| | | |
|---|---|---|
| 5,850,181 A | 12/1998 | Heinrich et al. |
| 5,850,187 A | 12/1998 | Carrender et al. |
| 5,856,788 A | 1/1999 | Walter et al. |
| 5,872,523 A | 2/1999 | Dellaverson et al. |
| 5,874,724 A | 2/1999 | Cato |
| 5,874,896 A | 2/1999 | Lowe et al. |
| 5,874,902 A | 2/1999 | Heinrich et al. |
| 5,883,582 A | 3/1999 | Boweres et al. |
| 5,883,886 A | 3/1999 | Eaton et al. |
| 5,902,437 A | 5/1999 | McDonough et al. |
| 5,905,249 A | 5/1999 | Reddersen et al. |
| 5,905,949 A | 5/1999 | Hawkes et al. |
| 5,906,228 A | 5/1999 | Keller |
| 5,914,862 A | 6/1999 | Ferguson et al. |
| 5,920,287 A | 7/1999 | Belcher et al. |
| 5,923,001 A | 7/1999 | Morris et al. |
| 5,923,572 A | 7/1999 | Pollock |
| 5,929,760 A | 7/1999 | Monahan |
| 5,929,779 A | 7/1999 | MacLellan et al. |
| 5,932,280 A | 8/1999 | Roth |
| 5,936,527 A | 8/1999 | Isaacman et al. |
| 5,939,223 A | 8/1999 | Cotte et al. |
| 5,939,984 A | 8/1999 | Brady et al. |
| 5,942,978 A | 8/1999 | Shafer |
| 5,942,987 A | 8/1999 | Heinrich et al. |
| 5,944,069 A | 8/1999 | Nusbaumer et al. |
| 5,945,920 A | 8/1999 | Maletsky |
| 5,945,938 A | 8/1999 | Chia et al. |
| 5,949,335 A | 9/1999 | Maynard |
| 5,950,110 A | 9/1999 | Hendrickson |
| 5,955,950 A | 9/1999 | Gallagher, III et al. |
| 5,955,951 A | 9/1999 | Wischerop et al. |
| 5,959,530 A | 9/1999 | Lupien, Jr. et al. |
| 5,959,531 A | 9/1999 | Gallagher, III et al. |
| 5,959,533 A | 9/1999 | Layson, Jr. et al. |
| 5,960,844 A | 10/1999 | Hamaya |
| 5,962,834 A | 10/1999 | Markman |
| 5,962,837 A | 10/1999 | Main et al. |
| 5,963,132 A | 10/1999 | Yoakum |
| 5,963,134 A | 10/1999 | Bowers et al. |
| 5,963,136 A | 10/1999 | O'Brien |
| 5,963,144 A | 10/1999 | Kruest |
| 5,964,656 A | 10/1999 | Lawler, Jr. et al. |
| 5,969,609 A | 10/1999 | Murdoch |
| 5,972,156 A | 10/1999 | Brady et al. |
| 5,973,598 A | 10/1999 | Beigel |
| 5,973,599 A | 10/1999 | Nicholson et al. |
| 5,973,600 A | 10/1999 | Mosher, Jr. |
| 5,973,601 A | 10/1999 | Campana, Jr. |
| 5,974,078 A | 10/1999 | Tuttle et al. |
| 5,983,118 A | 11/1999 | Lee |
| 5,983,288 A | 11/1999 | Visee |
| 5,986,562 A | 11/1999 | Nikolich |
| 5,987,331 A | 11/1999 | Grube et al. |
| 5,987,739 A | 11/1999 | Lake |
| 5,989,751 A | 11/1999 | Cotte et al. |
| 5,990,042 A | 11/1999 | Mochizuki et al. |
| 5,995,006 A | 11/1999 | Walsh |
| 5,995,046 A | 11/1999 | Belcher et al. |
| 5,995,048 A | 11/1999 | Smithgall et al. |
| 6,008,727 A | 12/1999 | Want et al. |
| 6,013,949 A | 1/2000 | Tuttle |
| 6,018,299 A | 1/2000 | Eberhardt |
| 6,021,315 A | 2/2000 | Telewski |
| 6,024,142 A | 2/2000 | Bates |
| 6,025,780 A | 2/2000 | Bowers et al. |
| 6,025,781 A | 2/2000 | Deschenes |
| 6,025,784 A | 2/2000 | Mish |
| 6,025,860 A | 2/2000 | Rosenfeld et al. |
| 6,027,027 A | 2/2000 | Smithgall |
| 6,030,728 A | 2/2000 | Cotte et al. |
| 6,036,099 A | 3/2000 | Leighton |
| 6,038,118 A | 3/2000 | Guerra |
| 6,040,773 A | 3/2000 | Vega et al. |
| 6,040,774 A | 3/2000 | Schepps |
| 6,043,746 A | 3/2000 | Sorrells |
| 6,044,353 A | 3/2000 | Pugliese, III |
| 6,045,652 A | 4/2000 | Tuttle et al. |
| 6,046,676 A | 4/2000 | Ward et al. |
| 6,046,683 A | 4/2000 | Pidwerbetsky et al. |
| 6,049,278 A | 4/2000 | Guthrie et al. |
| 6,049,745 A | 4/2000 | Douglas et al. |
| 6,069,564 A | 5/2000 | Hatano et al. |
| 6,072,383 A | 6/2000 | Gallagher, III et al. |
| 6,072,994 A | 6/2000 | Phillips et al. |
| 6,075,707 A | 6/2000 | Ferguson et al. |
| 6,075,997 A | 6/2000 | Lindqvist et al. |
| 6,078,251 A | 6/2000 | Landt et al. |
| 6,078,259 A | 6/2000 | Brady et al. |
| 6,078,791 A | 6/2000 | Tuttle et al. |
| 6,084,967 A | 7/2000 | Kennedy et al. |
| 6,087,930 A | 7/2000 | Kulka et al. |
| 6,087,940 A | 7/2000 | Caperna et al. |
| 6,091,332 A | 7/2000 | Eberhardt et al. |
| 6,094,138 A | 7/2000 | Eberhardt et al. |
| 6,094,173 A | 7/2000 | Nylander |
| 6,094,565 A | 7/2000 | Alberth et al. |
| 6,097,301 A | 8/2000 | Tuttle |
| 6,100,804 A | 8/2000 | Brady et al. |
| 6,104,281 A | 8/2000 | Heinrich et al. |
| 6,104,291 A | 8/2000 | Beauvillier et al. |
| 6,104,295 A | 8/2000 | Gaisser et al. |
| 6,107,920 A | 8/2000 | Eberhardt et al. |
| 6,108,636 A | 8/2000 | Yap et al. |
| 6,111,506 A | 8/2000 | Yap et al. |
| 6,123,796 A | 9/2000 | Kathmann et al. |
| 6,175,332 B1 | 1/2001 | Fedors |

* cited by examiner

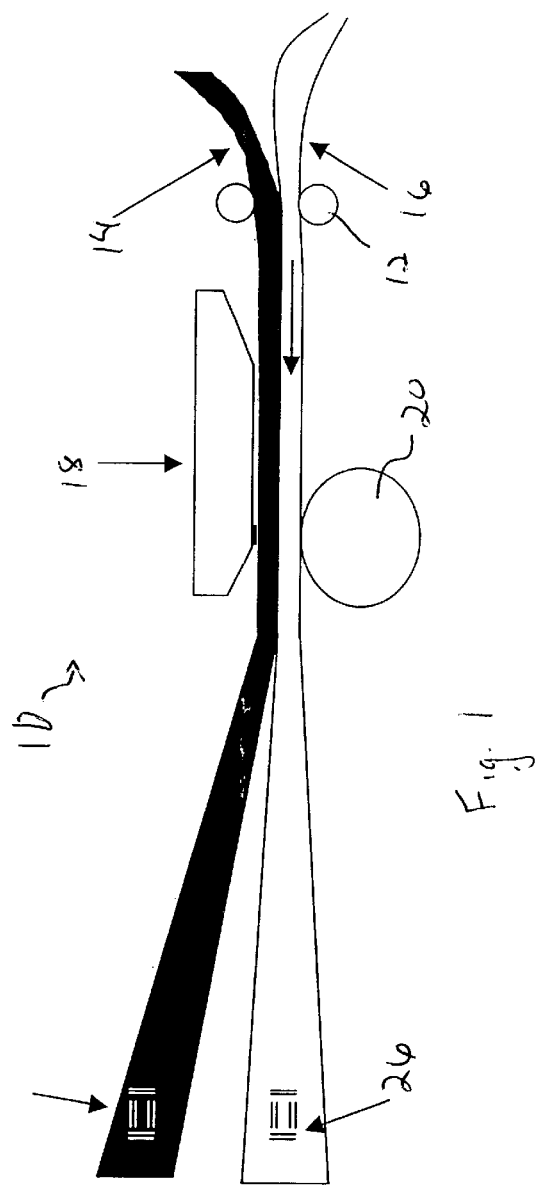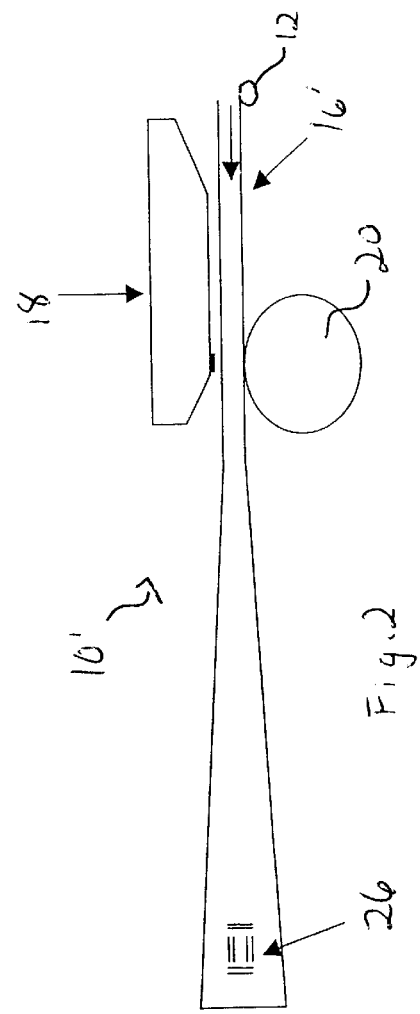

METHOD AND SYSTEM FOR FORMING RF REFLECTIVE PATHWAYS

CROSS REFERENCE TO RELATED APPLICATIONS

This application is a Continuation-in-Part of application Ser. No. 09/839,126 filed on Apr. 23, 2001. This application also claims priority under §119(e) of application Ser. No. 60/295,580 filed on Jun. 5, 2001. The entire contents of both of the aforementioned applications are hereby incorporated by reference.

BACKGROUND OF THE INVENTION

1. Field of the Invention

The present invention relates to a system and method for forming RF reflective pathways. In particular, the system and method is for making variably printed radio frequency antennas for radio frequency tags.

2. Description of the Background Art

Various printing arrangements for forming antennas are known. However, variable demand printing for forming electrically conductive pathways or antennas is not known.

One known method is from U.S. Pat. No. 4,265,703 to Terliska, the entire contents of which are hereby incorporated by reference. In this patent, a method of preparing a fibrous structure containing metallic fibers is disclosed. Other patents to Greene U.S. Pat. Nos., 5,204,681, 5,291,205 and 5,581,257 disclose different radio frequency automatic identification systems. These patents try to detect small resonating particles using an interrogating RF signal.

A resonating pattern can be chosen for an item to be labeled. This pattern can be a designation for the item such as a barcode or it can be a random pattern which is to be assigned to a database for later confirmation. In a barcode situation, each barcode is associated with a particular product. Likewise, a resonating pattern can be chosen according to the product being labeled. In this case, an identification tag may be created which has a random but known response associated with it so that future scanning of that pattern can be associated with the item labeled. Advantages of using a resonating pattern system over current, widely used barcode system is the ability to read in non-line of sight situations, the ability to read through dirt, soiling, etc. on the surface and the possibility of extending automation by not requiring human alignment of the reading system.

SUMMARY OF THE INVENTION

Accordingly, it is an object of the present invention to provide a method and system to produce variable on-demand printing of radio frequency reflective (hereinafter RF reflective) pathways. Such pathways can be used to form antennas for radio frequency tags. Two different methods can be utilized for forming such conductive pathways.

In one of these methods, the following steps are carried out: providing a thermal transfer ribbon, moving the thermal transfer ribbon past a heat source, engaging the thermal transfer ribbon with a receiver substrate as the thermal transfer ribbon moves past the heat source, selectively heating portions of the thermal transfer ribbon with the heat source, and transferring a composition from the thermal transfer ribbon to the receiver substrate, the selective heating enabling a desired pattern of the composition to be transferred to the receiver substrate, the composition including a RF reflective material.

In another method for forming RF reflective pathways, the following steps are carried out: providing a substrate coated with reactive material, moving the substrate past a heat source, selectively heating portions of the substrate with the heat source, and developing the reactive material on the substrate during exposure to heat from the heat source to develop a desired pattern on the substrate, the reactive material becoming a RF reflective material.

Further, it is an object of the present invention to also provide a system for producing radio frequency tags comprising a conveyor for moving a substrate, a thermal print head, the conveyor moving the substrate past the thermal print head, the thermal print head being selectively actuatable to heat a desired pattern on the substrate, means on the substrate for reacting with the heat source to form RF reflective pathways, the means including a heat sensitive composition on the substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a schematic side view of a first system for forming RF reflective pathways of the present invention; and FIG. 2 is a schematic side view of a second system for forming RF reflective pathways of the present invention.

DETAILED DESCRIPTION OF THE PREFERRED EMBODIMENT

Referring in detail to the drawings and with particular reference to FIG. 1, a first system 10 for forming RF reflective pathways is shown. While the specification will discuss RF reflective pathways, it should be noted that these pathways will also be electrically conductive. This system 10 includes a conveyor 12 for infeeding a thermal transfer ribbon 14 and a received substrate 16. This conveyor 12 is only schematically shown in FIG. 1 as a pair of feed rolls. It should be appreciated that any type of conveyor system could be utilized. For example, a belt conveyor, chain conveyor, series of rollers, or any other known conveyor system could be used. Moreover, while only a pair of rollers 12 are shown, it should be contemplated that a continuous conveyor can be used over the length of the system 10 or any suitable number of conveyor units can be incorporated into the conveyor system.

The thermal transfer ribbon 14 and receiver substrate 16 are fed past a heat source or thermal print head 18. The thermal print head 18 will selectively heat portions of the thermal transfer ribbon 14 to ultimately form a desired pattern on the receiver 16, as will be discussed below. While such a thermal print head 18 is known, its use in a method for forming RF reflective pathways is new. In addition, a backing roller 20 is provided to support the thermal transfer ribbon 14 and receiver substrate 16. While a backing roller 20 is shown, it should be noted that other support surfaces could be used. For example, a flat supporting table or other structure could be opposed to the print head 18.

The thermal transfer ribbon 14 has a reactive coating or a conductive transferable material thereon. When this reactive coating or material is heated by the thermal print head 18, a RF reflective pathway can be printed on the receiver substrate 16. Thermal transfer ribbon 14 either has a conductive material or RF reflective material or a material that becomes conductive or RF reflective upon the application of heat. The heat from print head 18 will serve to transfer the material to receiver substrate 16 and in some instances will also serve to activate the material to make it conductive or RF reflective. In those circumstances, the transferred composition will be a RF reflective precursor.

The use of this print head 18 allows printing of a pathway in any shape, length, or size onto the receiver substrate 16. Thus, great flexibility is had with the use of the thermal print head 18. The RF reflective pathway 26 is schematically shown in FIG. 1. While a generally rectangular pathway is shown, it is important to note that the length, width, shape and size of the pathway can easily be varied by using print head 18. The conveyor 12 will enable on-the-fly printing of pathways 26. Of course, batch processing is also possible. In such an arrangement, a continuous transfer ribbon and receiver substrate can be incrementally fed past the print head 18 or discrete portions of a ribbon 14 and substrate 16 could be used. For example, a feeder conveyor could move rectangular overlaying sheets of transfer ribbon and substrate through the system 10 past the print head 18.

The thermal transfer ribbon 14 is brought into engagement with the receiver substrate 16. This engagement, along with the heating of the thermal transfer ribbon 14 by the thermal print head 18, will cause transfer of a composition from the ribbon 14 to the receiver substrate 16. Thus, a complicated arrangement using magnets, as taught in U.S. Pat. No. 5,061,093 to Yamaguchi et al. for example, is not needed.

The thermal transfer ribbon 14 is coated with the composition. The transfer ribbon is made up of a transfer substrate which can be made from a polymeric film or paper. Suitable transfer substrate materials include, but are not limited to, paper, polyester, polyethylene naphthalate, polyamide, polyolefin, cellulose and polycarbonate. One preferred transfer substrate is polyester film, manufactured by Dupont™ under the Mylar™ brand name. Generally, Mylar™ is a polyester flexible film. Important properties of the transfer substrate include high tensile strength, thin thickness and low heat resistance.

The transfer substrate of the thermal transfer ribbon is coated with a conductive composition that is designed to be transferred to the received substrate 16 using the thermal print head 18. This coating is comprised of a conductive material, wax, binders, surfactants, dispersants and other additives. The primary component of the transfer layer is the RF reflective material. The material may be comprised of metallic inks, metallic substances, metallic dispersions, metallic salts, carbon based inks, or other conductive substances, etc. A preferred metallic substance is manufactured by Parelec™ under the Paramod™ brand name. Generally, the higher the conductivity or RF reflectance of the conductive material, the better.

The transfer coating for the thermal transfer ribbon 14 also contains a wax as another main component. The wax is designed to melt or soften under the heat supplied by the thermal print head 18. This will aid in the transfer of the coating layer to the receiver substrate 16. Examples of suitable waxes are carnuaba wax, paraffin wax, low molecular weight polyethylene wax, etc.

Binders are also included in the thermal transfer ribbon 14. These binders in the coating layer aid in cohesion of the coating and provide tack properties for adhesion to the receiver substrate 16. Examples of suitable binders are styrene copolymers, polyethylene resin, polystyrene, vinyl chloride polymers, vinyl acetate polymers, etc. Surfactants, dispersant and other additives are incorporated as needed for proper processing, coating and to aid in the transfer properties.

The transfer coating layer can be applied to the transfer ribbon substrate using a Meyer rod, airknife, roll coater, blade or any suitable coating method. The coat weight applied is in the range 1.5 g/m$^2$ to 30 g/m$^2$.

The coated transfer ribbon can then be used with the thermal print head 18 and a thermal printer to create any size, shape, length, etc. a radio frequency identification tag. The conductive material is transferred onto the receiver sheet 16. This receiver sheet is a substantially non-conductive substrate such as paper, plastic film and the like. Alternatively, the sheet can be a conductive substrate that has been coated with an electrical insulating layer.

Turning now to FIG. 2, a second method and system 10' for forming RF reflective pathways will be described. These pathways can also be used for antennas in radio frequency tags, similarly to that described in FIG. 1. Many of the components and alternative arrangements in this second system 10' are the same as that in the first system, and their description will not be repeated.

In the second system 10', a thermal transfer ribbon 14 is not used. Rather, a second receiver substrate 16' is utilized. This substrate used can be selected from paper, polymeric films, cellulose materials and other thin, flat substrates. This substrate is coated with a composition that is designed to react when exposed to heat generated from the thermal print head 18. This coating is comprised of a reactive material forming an RF reflective material. This coating could include a reducible metallic material, binders, fillers, surfactants, dispersants, and other additives.

The primary component of the coating layer is the reactive material forming the RF reflective material such as a reducible metallic material. This reducible material may be comprised of sorbitol copper formate, copper sulfate, cuprite, tenorite, silver nitrate, and the like. The higher the conductivity of the reduced reducible material, the better.

Binders are included in the coating layer to aid in cohesion of the coating while not inhibiting the conductivity of the reduced material. Examples of suitable binders are styrene butadiene copolymers, polyvinyl alcohols, starch, vinyl chloride polymers, vinyl acetate polymers, methyl cellulose, etc. Surfactants, dispersants and other additives are incorporated as needed for proper processing, coating, and to aid in the transfer properties. The coating layer can be applied to the substrate using a Meyer rod, airknife, roll coater, blade or any other suitable coating method. The coat weight applied is in the range of 1.5 g/m$^2$ to 30 g/m$^2$.

With the present system, variable, on-demand printed RF reflective pathways can be formed. The invention utilizes two methods for printing the pathways, thermal transfer and direct thermal. The printed pathways are suitable for use as a radio frequency identification tag. With the first described thermal transfer method, a ribbon 14 coated with a conductive material is used that is transferred to another substrate 16 upon application of heat by the thermal print head 18. In the direct thermal method, a receiver substrate 16' is used that has a conductive material which, when exposed to heat from a thermal print head 18, will form the pathways.

To summarize the steps of the first method of forming RF reflective pathways, a thermal transfer ribbon 14 is provided. This thermal transfer ribbon 14 is moved past a heat source or thermal print head 18 by conveyor 12. The thermal transfer ribbon 14 is engaged with a receiver substrate as it moves past the heat source or thermal print head 18. This thermal print head 18 will selectively heat portions of the thermal transfer ribbon 14, in order to transfer a composition to the receiver substrate 16. This transferred composition forms a RF reflective pathway 26. The selective heating by the thermal print head 18 enables a desired pattern of composition to be transferred to the receiver substrate 16.

In the second method, a substrate 16' is provided with a reactive material. This substrate 16' is moved by conveyor 12 past a heat source or thermal print head 18. The heat source or thermal print head 18 can selectively heat portions of the substrate. This will develop the reactive material on the substrate 16' to develop a desired pattern on the substrate. This desired pattern will form the RF reflective pathway 26.

With either method, a system 10 or 10' can be used. The conductive composition on ribbon 14 or the reducible material on the second receiver substrate will act as means on the substrate for reacting to heat from the heat source or print head 18. The conductive composition or reducible material is a heat sensitive composition on substrate 14 or 16'.

The pattern of the RF reflective pathways, either developed in a desired pattern on the substrate or transferred to the receiver substrate 16 can take the pattern of a conventional bar code, for example of the type comprising a plurality of spaced apart parallel vertical lines arranged in a row.

The bar code of the above type, or bar code configured of other pattern or standard, advantageously can be of multiple functionality, readable by either reflecting an RF signal or optically or infrared scannable, or all three.

The reactive material forming a RF reflective material can optionally additionally include some portion of dye precursors such as colorless chromogenic materials and acidic developers. Developers can include phenolic reactive materials or near-IR phthalides such as taught by Mathiaparanam in U.S. Pat. Nos. 5,157,012 or 5,086,171, said patents incorporated herein by reference.

A variety of acidic developer materials are known for colorizing chromogenic materials. Acidic developer materials include: clays, treated clays (U.S. Pat. Nos. 3,622,364 and 3,753,761); aromatic carboxylic acids such as salicyclic acid; derivatives of aromatic carboxylic acids and metal salts thereof (U.S. Pat. No. 4,022,936). Various phenol based polymeric materials such as phenol-formaldehyde polymers: (U.S. Pat. Nos. 3,455,721, 3,244,550 and 4,573,063 and 3,672,935) metal-modified phenolic resins (U.S. Pat. Nos. 3,732,120; 3,737,410; 4,165,102; 4,165,103; 4,166,644 and 4,188,456; addition products of phenol and a diolefinic alkylated or alkenylated cyclic hydrocarbon (U.S. Pat. No. 4,573,063), a glass comprising a biphenol color developer and a resinous material (U.S. Pat. No. 4,546,365) a phenol-aldehyde polymeric material (U.S. Pat. No. 3,672,935), oil soluble metal salts of phenol-aldehyde novolak resins such as the zinc salt of p-octylphenol formaldehyde (U.S. Pat. No. 3,732,120; or, oil soluble water insoluble metal salts such as zinc hexonate and an oil soluble phenol-aldehyde novalak resin (U.S. Pat. No. 3,723,156).

Chromogenic materials include compounds such as the phthalide, leucauramine and fluoran compounds, which are well known color-forming compounds. Examples of chromogenic materials include Crystal Violet Lactone (3,3-bis (4-dimethylaminophenyl)-6-dimethylaminophthalide, U.S. Pat. No. RE. 23,024) 3,3-bis(4-diethylaminophenyl)-6-dimethylaminophthalide; phenyl-, indol-, pyrrol-, and carbazol-substituted phthalides (form example, in U.S. Pat. Nos. 3,491,111; 3,491,112; 3,491,116; 3,509,174); nitro-, amino-, amido-, sulfonamido-, aminobenzylidene-, halo-, anilino-substituted fluorans (for example, in U.S. Pat. Nos. 3,624,107; 3,627,787; 3,641,011; 3,642,828; 3,681,390); spirodipyrans (U.S. Pat. No. 3,971,808); and pyridine and pyrazine compounds (for example, in U.S. Pat. Nos. 3,775, 424 and 3,853,869. Other chromogenic compounds include: 3-diethylamino-6-methyl-7-anilino-flouran (U.S. Pat. No. 3,681,390); 2-anilino-3-methyl-6-dibutylaminofluoran (U.S. Pat. No. 4,510,513) also known as 3-dibutylamino-6-methyl-7-anilino-fluoran; 3-dibutylamino-7(2-chloroanilino) fluoran; 3-(N-ethyl-N-tetrahydrofurfurylamino)-6-methyl-7-3,5',6 tris (dimethylamino) spiro [9H-fluorene-9,1' (3'H)-isobenzofuran]-3'-one; 7-(1-ethyl-2-methylindol-3-yl)-7-(4-diethylamino-2-ethoxyphenyl)-5,7,-dihydrofuro[3,4-b] pyridin-5-one (U.S. Pat. No. 4,246,318; 3-diethylamino-7-(2-chloroanilino)fluoran (U.S. Pat. No. 3,920,510); 3-(N-methylcyclohexylamino)-6-methyl-7-anilinofluoran (U.S. Pat. No. 3,959,571); 7-(1-octyl-2-methylindol-3-yl)-7-7(4-diethylamino-2-ethoxyphenyl)-5,7-dihydr ofuro[3,4-b] p7ridin-5-one;3-diethylamino-7,8-benzofluoran; 3,3-bis(1-ethyl-2-methylindol-3-yl)phthalide; 3-diethylamino-7-dibenzylamino-2,2'-spiro-di-[2H-1-benzopyran] and mixtures of any of the foregoing.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A method of forming radio frequency tags, comprising the steps of:

providing a thermal transfer ribbon;

moving the thermal transfer ribbon past a heat source;

engaging the thermal transfer ribbon with a flexible receiver substrate as the thermal transfer ribbon moves past the heat source;

using paper or film as the receiver substrate;

selectively heating portions of the thermal transfer ribbon with the heat source; and transferring a composition from the thermal transfer ribbon to the receiver substrate, the selective heating enabling a desired resonating pattern of the composition to be transferred to the paper or film receiver substrate.

2. The method of forming radio frequency tags as recited in claim 1, wherein the composition transferred from the thermal transfer ribbon is a RF reflective material.

3. The method of forming radio frequency tags as recited in claim 1, wherein the composition transferred from the thermal transfer ribbon is a RF reflective precursor which becomes a RF reflective material upon application of heat from the heat source.

4. The method of forming radio frequency tags as recited in claim 1, further comprising the step of using a thermal print head as the heat source.

5. The method of forming radio frequency tags as recited in claim 1, wherein the thermal transfer ribbon fails to have magnetic particles and wherein transfer of the composition occurs solely due to heating and contact of the composition with the receiver substrate.

6. The method of forming radio frequency tags as recited in claim 1, further comprising the steps of:
   using a polymeric film or paper as the transfer ribbon;
   coating the transfer ribbon with the conductive material and with at least one of wax, binders, surfactants and dispersants; and
   using at least one of metallic inks, metallic substances, metallic dispersions, metallic salts, carbon based inks as the composition.

7. The method of forming radio frequency tags as recited in claim 6, further comprising the steps of:
   using at least one of carnuaba wax, paraffin wax, low molecular weight polyethylene wax as the wax in the transfer ribbon; and
   using at least one of styrene copolymers, polyethylene resin, polystyrene, vinyl chloride polymers, and vinyl acetate polymers as the binders in the transfer ribbon.

8. A method of forming radio frequency tags, comprising the steps of:
   providing a substrate coated with reactive material;
   moving the substrate past a heat source;
   selectively heating portions of the substrate with the heat source; and
   developing the reactive material on the substrate during exposure to heat from the heat source to develop a desired resonating pattern on the substrate, the reactive material forming a RF reflective material.

9. The method of forming radio frequency tags as recited in claim 8, further comprising the steps of:
   using a cellulosic material, a polymeric film or paper as the substrate;
   coating the substrate with the RF reflective material and with at least one of binders, surfactants and dispersants, the RF reflective material being a reducible metallic material.

10. The method of forming radio frequency tags as recited in claim 9, further comprising the step of using at least one of sorbitol copper formate, copper sulfate, cuprite, tenorite and silver nitrate as reactive material which forms the RF reflective material.

11. The method of forming radio frequency tags as recited in claim 9, further comprising the step of using at least one of styrene butadiene copolymers, polyvinyl alcohols, starch, vinyl chloride polymers, vinyl acetate polymers and methyl cellulose as the binders of the substrate.

12. The method of forming radio frequency tags as recited in claim 8, further comprising the step of using a thermal print head as the heat source.

13. The method of forming radio frequency tags as recited in claim 8, wherein in developing the reactive material on the substrate during exposure to heat from the heat source to develop a desired resonating pattern, the pattern is a bar code.

14. The method according to claim 13, further comprising the steps of using as the reactive material, in addition, a chromogenic material and acidic developer material.

15. The method according to claim 13, further comprising in providing a substrate coated with reactive material, including in addition a chromogenic material and acidic developer material.

16. The method according to claim 8, further comprising the steps of using as the reactive material, in addition, a chromogenic material and acidic developer material.

17. The method according to claim 8, further comprising in providing a substrate coated with reactive material, including in addition a chromogenic material and acidic developer material.

* * * * *